United States Patent [19]
van Attekum et al.

[11] Patent Number: 4,732,869
[45] Date of Patent: Mar. 22, 1988

[54] METHOD OF FORMING IMPLANTED REGIONS IN A SEMICONDUCTOR DEVICE BY USE OF A THREE LAYER MASKING STRUCTURE

[75] Inventors: Paulus M. T. M. van Attekum; Hubertus J. den Blanken; Paulus A. van der Plas; Reinier de Werdt, all of Eindhoven, Netherlands

[73] Assignee: U.S. Philips Corporation, New York, N.Y.

[21] Appl. No.: 880,480

[22] Filed: Jun. 30, 1986

[30] Foreign Application Priority Data

Jul. 11, 1985 [NL] Netherlands .................. 8501992

[51] Int. Cl.$^4$ ............... H01L 21/225; H01L 29/78
[52] U.S. Cl. ........................ 437/34; 357/42; 357/91; 437/36; 437/56; 437/147
[58] Field of Search ............. 29/571, 576 B; 148/1.5, 148/187; 357/42, 91

[56] References Cited

U.S. PATENT DOCUMENTS

| | | |
|---|---|---|
| 4,368,573 | 1/1983 | De Brebisson et al. .............. 29/571 |
| 4,420,872 | 12/1983 | Zaldivar ................................ 29/571 |
| 4,459,740 | 7/1984 | Schwabe et al. .................... 148/187 |
| 4,506,437 | 3/1985 | Godejahn, Jr. ...................... 148/1.5 |
| 4,525,920 | 7/1985 | Jacobs et al. ......................... 29/571 |
| 4,535,532 | 8/1985 | Lancaster .......................... 29/576 B |
| 4,554,726 | 11/1985 | Hillenius et al. ...................... 29/571 |
| 4,646,425 | 3/1987 | Owens et al. ...................... 29/576 B |

FOREIGN PATENT DOCUMENTS 0074215  3/1983  European Pat. Off.

OTHER PUBLICATIONS

Combs, IEEE-IEDM, 1981, pp. 346-349.
Bergeron et al., Solid State Tech., Aug. 1982, p. 98.
Kimizuka et al., J. Vac. Sci. Technol B-3, Jan.-Feb. 1985, p. 16.
Taur et al., IEEE-Trans. Electron Devices, Ed.-32, (1985), 203.

Primary Examiner—Upendra Roy
Attorney, Agent, or Firm—Paul R. Miller

[57] ABSTRACT

A method is provided in which an implantation treatment is carried out at a high energy of implantation in a semiconductor body (1) provided with a pattern of field insulation (6a) and in which the semiconductor body is provided with a masking, comprising a comparatively thin layer (8), a second comparatively thick layer (9) of a semi-masking material and a third comparatively thin layer (10). The second layer (9) is provided with openings (12) and the first layer (8) covers at least those parts of the surface which correspond to these openings (12). The third layer (10) has openings (22) each corresponding to one of the openings (12). The material of the first layer (8) differs from that of the second layer (9) and the material of the second layer (9) differs from that of the third layer (10). Preferably, simultaneously with the second layer (9) on the front side a semiconductor layer (19) is provided on the back side (3) of the semiconductor body (1).

16 Claims, 16 Drawing Figures

METHOD OF FORMING IMPLANTED REGIONS IN A SEMICONDUCTOR DEVICE BY USE OF A THREE LAYER MASKING STRUCTURE The invention relates to a method of manufacturing a semiconductor device, in which a semiconductor body having a major surface and one or more active regions, which are located at this major surface and which, viewed on this major surface, are bounded by a first partern of field insulation having a first thickness, is provided with a masking with a second pattern having one or more openings which are located so that through each opening at least a part of the one or more active regions is accessible for doping, and in which for this doping an implantation treatment is carried out at a given implantation energy with the masking comprising a layer provided with openings made of a semi-masking material for the ions used in the implantation treatment and with this layer having a second thickness, while the given implantation energy is chosen to be so high that in the part of the one or more active regions accessible for doping the penetration depth of the dopant is at least practically equal to the first layer thickness, where the layer of semi-masking materials provided with openings being is a comparatively thick second layer of a second material which is provided on a comparatively thin first layer of a first material also belonging to the masking with, the first and second materials being different from each other and a third layer of the masking being constituted by a layer of a third material which is located on the second layer and has one or more further openings, where each further opening corresponds to one of the one or more openings in the second layer with, the third material differing from the second material and with, the layer of semi-masking material provided with openings being entirely removed from the semiconductor body.

Background of the Invention

Such a method is known from European Patent Application published on Mar. 16, 1983 under No. 74215. In this case, the masking is constituted by a thin first layer of silicon oxide, a thicker second layer of polycrystalline silicon and a third layer of photosensitive material which has substantially the same thickness as the second layer. After the implantation treatment, a metal layer is provided, of which the part located on the masking is removed by dissolving the photosensitive layer. Subsequently, the polycrystalline silicon layer of the masking is removed. The metal pattern thus obtained forms a complementary mask, which accurately masks those parts of the semiconductor body which were subjected before to the implantation treatment. By using a second implantation treatment with a doping of the opposite type, doped regions of opposite conductivity types are obtained in the semiconductor body, which accurately adjoin each other along the edge of the masking or the metal pattern. During the first implantation treatment, boron is implanted at an implantation energy of 120 keV. For the second implantation treatment, phosphor is used at an implantation energy of 200 to 300 keV.

In the method known from the publication "Scalable retrograde p-well CMOS technology", International Electron Devices Meeting 1981, Technical Digest, p. 346–349, an implantation treatment is carried out for doping the active regions for forming a so-called "retrograde p-well". Boron ions are implanted at a dose of $2.10^{13}$ per $cm^2$. The penetration depth of these ions, i.e. the depth under the surface at which after the implantation treatment the concentration of the implanted dopant practically has a maximum, is in the relevant active regions about 1 /$\mu$m. The field insulation consists of a pattern of oxide, which is obtained in a usual manner by local oxidation of the semiconductor body. The thickness of the pattern of field oxide, i.e. the first layer thickness, is about 0.8 /$\mu$m. During the implantation treatment, a masking (not shown) is present on the semiconductor body, which masking covers a number of the active regions and has openings at the area of other active regions, within which openings besides the relevant active region also an adjacent part of the field oxide surrounding this region is always disposed. The implanted dopant penetrates within the openings both in the active regions and under the part of the field oxide not covered by the masking into the semiconductor material of the semiconductor body. On the assumption that the penetration depth (the so-called "range") in silicon dioxide is approximately equal to that in silicon, the maximum doping concentration, which in the active regions lies about 1 /$\mu$m under the semiconductor surface, will be situated under the field oxide at a depth of about 0.2 /$\mu$m. Consequently, after the treatments at high temperature required for the manufacture of the complete integrated circuit, the surface concentration of the doping of the "p-well" in the parts located under the field oxide is comparatively high, as a result of which a specific doping treatment for obtaining p-type channel stopper zones adjoining the field oxide may not be required. In this case, as a result of the comparatively high surface concentration under the field oxide, the parasitic threshold voltage for channel formation under this oxide in the p-well is already sufficiently large.

In the afore-mentioned known methods, the accelerated ions penetrate within the openings, through the parts of the field oxide exposed there, into the subjacent semiconductor material. During the implantation treatment, the field oxide therefore does not mask against the ions used in this treatment. This is due to the fact that silicon dioxide is for the accelerated ions not a really dense material especially as compared with silicon. Silicon dioxide is a semi-masking material. In the present description, this material is to be understood to mean a material having an average penetration depth or "range" of the accelerated ions to be used which is comparable with or is at least practically of the same order as the average penetration depth of these ions in the semiconductor material to be masked.

It is usual in implantation treatments to use a patterned photolacquer layer as a mask. The photolacquers (resists) usual in the semiconductor technology are semimasking materials, however. In order that it can be used as a mask, the thickness of the layer of semi-masking material, i.e. the second thickness, has to be larger than the average penetration depth of the accelerated ions to be used in this material in order that the accelerated ions can be stopped completely. This means inter alia that during implantation treatments at a high implantation energy and with a masking of semi-masking material, as in the present method, the masking must have a considerable thickness. In such comparatively thick masking photolacquer layers, the desired masking pattern can often be provided only with difficulty with the desired accuracy.

SUMMARY OF THE INVENTION

The present invention has inter alia for its object to provide a method of masking which is particularly suitable for use in implantation treatments, in which comparatively high implantation energies are used. The term "implantation energy" is to be understood herein, as usual, to mean the product of the number of electron charges per ion and the acceleration potential.

The present invention is based inter alia on the recognition of the fact that, in view of the increasingly smaller dimensions used in integrated circuits and the increasingly more stringent requirements imposed on the electrical properties of the integrated circuits and the circuit elements included therein, an adapted method of masking is desired for implantation at a high energy and that the masking used for this purpose may be of more complex nature as, for example, the flexibility, the additional possibilities and/or accuracy of dimensions to be realized are improved thereby.

The method of the kind described in the opening paragraph is characterized according to the invention in that the first material is chosen to be different from the material of which the pattern of field insulation at least mainly consists, this first layer covering at least those parts of the surface of the semiconductor body which correspond to the openings in the second layer, the third layer of the masking being a comparatively thin layer.

According to the present invention, a masking composed of at least three layers is consequently used. The semiconductor material of the active regions and/or the material of the pattern of field insulation can be screened and protected by the first or lower layer. Thus, for example, there is a wider choice for the materials of the second and the third layer of the masking. Where required, this first layer may form a suitable screening layer when patterning and/or removing the second and/or the third layer. Moreover, this screening allows that plasma etching can be used for patterning the masking without damage being caused in the subjacent semiconductor body. The second layer especially serves to ensure that the masking can be given the desired comparatively large thickness. For this layer a material can be chosen which can be readily applied in a large thickness. The third layer provides the possibility of forming openings in the masking comparatively accurately. When, for example, by means of photolithographic methods the comparatively thin third layer has first been patterned, this third layer can then serve as a masking during an etching treatment, in which the pattern is transferred accurately to the comparatively thick second layer.

The field insulation may be obtained, for example, by local oxidation of the semiconductor body or by providing and refilling grooves in the semiconductor body.

Preferably, the first material of the first layer comprises silicon nitride. Such a layer can be applied in a comparatively simple manner and a satisfactory screening for the underlying material is thus obtained.

In a further preferred embodiment of the method according to the invention, the third material is chosen to be different from the first material. When the first layer is a nitride layer, silicon oxide is particularly suitable as the third material. The processes of applying and patterning silicon oxide layers are usual processes in the semiconductor technology.

In an important preferred embodiment of the method according to the invention, the second layer used is a layer of which at least a sublayer consists of semiconductor material, while preferably simultaneously with this semiconductor layer of the masking a further layer of semiconductor material is formed on a second major surface of the semiconductor body located opposite to the first-mentioned major surface and extending substantially parallel thereto. This amorphous or polycrystalline further layer can then be used as a getter layer.

Also in connection with the desired good getter effect, the further layer may advantageously consist of semiconductor material having a comparatively high concentration of a dopant, such as phosphorus.

Preferably, already at a comparatively early stage of the manufacture of the semiconductor device, after the implantation treatment carried out at a given implantation energy, and before one or more doping treatments for obtaining semiconductor zones of circuit elements, the semiconductor body is subjected to a getter treatment. Such an early getter treatment can improve the quality of the semiconductor material in the active regions and of dielectric layers still to be grown onto the active regions. The electrical properties of the circuit elements to be formed in these active regions are favourably influenced thereby.

BRIEF DESCRIPTION OF THE DRAWINGS

The invention will be described more fully with reference to a few examples and the accompanying diagrammatic drawing, in which.

DESCRIPTION OF THE INVENTION

The first example is described with reference to FIGS. 1 to 5. All Figures are drawn, as usual, schematically and not to scale. For the sake of clarity of the Figures, dimensions and layer thicknesses are indicated without considering the mutual proportions.

Figure 1:
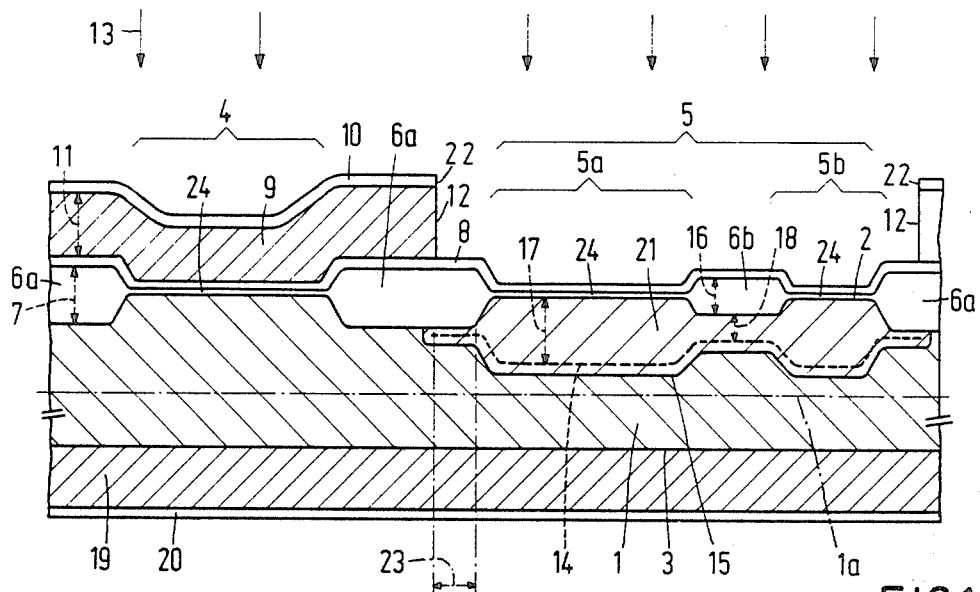
FIGS. 1 to 5 show cross-sections of a semiconductor body at different stages of the manufacture.
Figure 2:
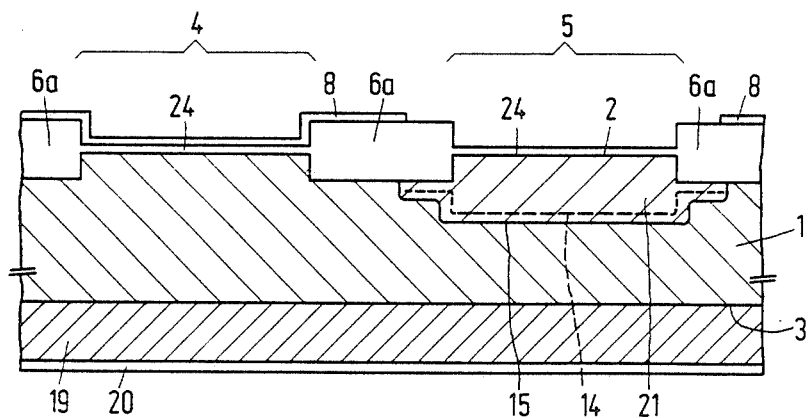

. FIG. 1 shows a semiconductor body 1, which may consist, for example, mainly of p-type silicon having a resistivity of about 10 $\Omega$cm. The starting material may be a homogeneously doped mono-crystalline silicon wafer, of which the major surface 2 is preferably a (100) surface. A silicon wafer may also be used consisting of a more highly doped substrate on which a more weakly doped epitaxial layer of sufficient thickness is situated. The circuit elements of the integrated circuit are then mainly provided in this epitaxial layer. This possibility is shown diagrammatically in FIG. 1 by the dot-anddash line 1a representing the interface between the substrate and the epitaxial layer.

The semiconductor body 1 can be provided in a usual manner at the major surface 2 with a first pattern of field insulation 6a. This pattern of field insulation 6a has a first thickness 7 and limits, viewed on the major surface 2, one or more active regions 4, 5. The active region 5 in this example has two parts 5a and 5b, between which an insulating region 6b is situated, which is integral with the pattern of field insulation 6a, but has a smaller thickness 16.

A masking 8, 9, 10 with a second pattern can now be provided on the semiconductor body with the insulating regions 6a and 6b. This masking has one or more openings 12 indicated by their edge, which are situated so that through each opening 12 at least part of the one or more active regions 4, 5 are accessible for doping. In the present example, the active region 5 is concerned, which as a whole lies within the opening 12. An implantation treatment is then carried out at a given energy, which is indicated by the arrows 13. The term "implantation energy" is to be understood to mean, as is usual, the product of the number of electron charges per ion and the acceleration potential.

The masking 8, 9, 10 has a layer 9 provided with the openings 12 and consisting of a semi-masking material for the ions used in the implantation treatment. The layer 9 has a second thickness 11. The implantation energy is chosen to be so high that in the part 5a, 5b, accessible for doping of the one or more active regions 4, 5, the penetration depth 17 of the dopant is at least substantially equal to the first thickness 7 of the field insulation 6a. Under the insulating region 6b, the accelerated ions penetrate to a smaller depth 18 into the semiconductor material of the semiconductor body 1 due to the fact that the ions have to penetrate in situ through the insulating region 6b and then lose part of their energy. If, for example, phosphorus is implanted, a continuous n-type region 21 can be obtained, which is separated by a pn junction 15 from the remaining part of the semiconductor body 1. This n-type region 21 may serve, for example, as substrate region of a p-channel field effect transistor to be provided therein, or as a collector or emitter region of a bipolar npn transistor. In the part 5b, for example, a substrate contact or a collector or emitter contact or, for example, also a second transistor may be provided.

The layer 9 provided with the openings 12 and consisting of semi-masking material is a second comparatively thick layer of a second material, which is provided on a comparatively thin first layer 8 of a first material forming also part of the masking 8, 9, 10 with the first layer 8 covering at least those parts of the surface of the semiconductor body 1 which correspond to the openings 12 in the second layer 9. The first and second materials are relatively different materials. The third layer 10 of the masking 8, 9, 10 is a comparatively thin layer of a third material, which is situated on the second layer 9. This third layer 10 has one or more further openings 22 with each further opening 22 corresponding to one of the one or more openings 12 in the second layer 9. The third material differs from the second material.

In a preferred embodiment of the method according to the invention, a masking 8, 9, 10 is used, of which the first layer 8 is a silicon nitride layer having a thickness of, for example, about 0.1 /μm and of which the second layer 9 is a polycrystalline or amorphous silicon layer having a thickness of, for example, about 1.5 /μm, while the third layer 10 is a thin silicon oxide layer which may be obtained, for example, by thermal oxidation of the silicon layer 9 and which has a thickness of, for example, about 0.2 /μm.

Before the advantages and the further details of the first example of the method according to the invention are disclosed, first the terms "penetration depth" and "semi-masking material" will be further explained.

In the present description, the terms "penetration depth" and "average penetration depth" are used synonymously and side by side. Both terms have the same meaning in this description and are generally designated by "range". During the implantation of accelerated ions in a body or layer of a given material, the term "penetration depth" or "range" is to be understood to mean the distance of the area in the body or the layer at which the concentration of the implanted material has a maximum from the surface of the body, or the layer, through which the accelerated ions have penetrated into the body or the layer. The concentration distribution of the implanted material around the concentration maximum can be characterized in a usual manner by a spread $\sigma$. The penetration depth generally depends inter alia upon the size of the ions, upon the acceleration energy, and upon the relevant material.

Many of the materials usual in the semi-conductor technology, such as silicon, silicon oxide, silicon (oxy)-nitride, but also the conventional photo-lacquers (resists), have a comparable penetration depth by accelerated ions. This means inter alia that often implantation can take place through thin layers of silicon oxide or silicon nitride in the subjacent semiconductor material. Another consequence is that layers of such materials can be used as a masking layer during implantation treatments only as far as the layer thickness is chosen to be sufficiently large to obtain the desired masking effect. This is in contrast with many metal layers, such as layers of molybdenum or tungsten or other not too light metals. The penetration depth of these materials is generally much smaller than the penetration depth of silicon so that metal layers often form a good masking material even if they are comparatively thin. In order to distinguish them from satisfactorily masking materials, such as heavy metals, the aforementioned materials, such as silicon oxide, are designated as "semi-masking" in the present description. In general the class or group of semi-masking materials comprises the materials having for the same accelerated ions and for the same implantation energy a penetration depth which is comparable with or is at least substantially of the same order as the penetration depth of the material of the body in which the accelerated ions have to be implanted. In other words: in maskings consisting of a layer of semi-masking material, the thickness of the masking layer will always be an important non-negligible parameter, which can determine whether the desired masking effect is or is not obtained.

In the present example, the openings 12 are obtained by anisotropic etching of the oxide layer 10 and the silicon layer 9, in which case a patterned photolacquer layer (not shown) can serve in the usual manner for a mask. This treatment can be carried out by means of conventional plasma etching techniques. The silicon oxide of the third layer 10 can be etched selectively with respect to the silicon of the second layer 9 and this silicon can be etched selectively with respect to the material of the first layer 8. The presence of the first layer 8 within the openings 12 has the advantage that in situ during etching any attack of the field insulation 6a, 6b and any damage of the active semiconductor body are avoided at least to a great extent. This first layer 8 preferably comprises silicon nitride.

Preferably, before, but otherwise after, the second layer is subjected to plasma etching, the photolacquer layer is removed in a usual manner. After the openings 12 have been provided, for example, an implantation treatment is carried out in which phosphrous is implanted at a dose of about $3.10^{12}$ per cm$^2$ at an implantation energy of about 800 keV. At the broken line 14, the concentration of the implanted phosphorus is a maximum. The penetration depth 17 into the parts 5a and 5b of the active region 5 is about 0.5 /μm. If desired, one or more implantation treatments may then be carried out at a lower energy. For example, phosphorous may be implanted at a dose of about $1.10^{12}$ per cm$^2$ and an energy of about 400 keV. By adaptation of the number of implantations, the doses, and/or the implantation energies, suitable doping concentration profiles can be obtained in the region 21. The number of subsequent treatments at high temperature, the duration of these treatments, and the temperature at which they are carried out are also of importance for the doping concentration profile. In such treatments, diffusion of the implanted doping can in fact take place. Between the implantation treatments and/or after termination of these treatments, if desired, one or more annealing treatments may be carried out in a usual manner inter alia in order to restore any damage and/or to activate the implanted doping.

In the present example, the pattern of field insulation 6a is obtained in a usual manner by local oxidation of the semiconductor body 1. A silicon nitride-containing layer can then be used as an oxidation mask. The thickness of this masking layer is, for example, about 0.1 /μm. If required, under this masking layer a further thin layer of silicon oxide or silicon oxynitride having a thickness of, for example, about 40 nm may be provided.

The oxidation mask covers the active regions 4 and 5 entirely. As the case may be, an implantation treatment for obtaining p-type channel stopper zones may subsequently be carried out, in which, if required, the active region 5 and its immediate surroundings are covered in a usual manner by a photolacquer pattern. After removal of the photolacquer pattern, a usual oxidation treatment is carried out. After the oxidation treatment, the thickness 7 is, for example, about 0.6 /μm. The thickness 16 may be, for example, about 0.4 /μm. After the oxidation treatment has been accomplished, the oxidation mask is removed entirely. If required, a fresh thin silicon oxide layer 24 is provided on the active regions 4, 5. The thickness of the layer 24 may be, for example, about 40 nm. Subsequently, the layers of the masking 8, 9, 10 can be provided.

As far as the pattern of field insulation 6a is not covered by the patterned layers 9 and 10 of the masking layers 8, 9, 10, the phosphorus ions implanted at a high energy penetrate through the field insulation 6a. The concentration maximum of the implanted dopant, which lies approximately on the broken line 14, will be located in situ about 0.3 /μm under the field insulation 6a. Under the field insulation 6a, the surface concentration of the doping at the interface between the n-type region 21 and the field insulation may be about 1 to $3.10^{16}$ per cm$^3$. Provided that the distance 23, over which the concentration maximum at the outer edge of the active region 5 lies at a substantially constant depth under the interface between silicon oxide and silicon, is not too small, the surface concentration offers a reasonable protection against undesired channel formation so that a channel stopper need no longer be provided. However, the required distance 23 also influences the admissible minimum distance between the active regions 4 and 5 and the circuit elements to be provided therein. The distance 23 can be reduced if the surface concentration in situ is increased As will appear, one of the advantages of the masking 8, 9, 10 resides in the flexibility, which becomes manifest inter alia in various possibilities to be described below, of obtaining favourable doping concentrations under the field insulation 6a without adversely affecting the desired doping concentration profile in the active region 5 itself.

Under the thin insulation region 6b, the penetration depth 18 of the dopant implanted at a high energy may amount, for example, to about 0.5 /μm. The surface concentration of the dopant will be under the insulation region 6b about 1 to $3.10^{16}$ per cm$^3$.

After the implantation treatments have been carried out, circuit elements can be provided in an otherwise usual manner in the active regions 4,5 and/or in layers to be formed in or on the semiconductor body 1. Especially if insulated gate field effect transistors are used in the semiconductor device, the quality of the semiconductor material in the active regions and of gate dielectrics to be provided on these regions is of importance. Inter alia in this connection it is advantageous to use semiconductor material for the second layer 9. Preferably, simultaneously with the second layer 9 of the masking 8, 9, 10 a further layer 19 of semiconductor material is provided on a second major surface 3 of the semiconductor body 1 located opposite to the firstmentioned major surface 2 and extending substantially parallel thereto.

In the present example, before the second layer 9 and the further layer 19 are provided, the entire major surface 3 is cleaned in a usual manner, during which treatment, for example, oxide and/or nitride layers that may be present are removed. During cleaning of the major surface 3, the opposite active side of the semiconductor body 1 may be covered by a protective photolacquer or wax layer, which is removed after the treatment. Subsequently, the further layer 19 on the major surface 3 is directly provided on the semiconductor material of the semiconductor body 1.

For the sake of completeness, it should be noted that it is also sufficient that at least a substantial part of the second major surface 3 is cleaned so that the major surface 3 may be covered, for example near the edges of the silicon wafer, by a protective layer during cleaning.

In a preferred embodiment of the method according to the invention, at least for the further layer 19, a semiconductor material is used having a comparatively high concentration of a dopant. This dopant can be incorporated in a usual manner during the step of providing the second and further layers 9 and 19, respectively. The further layer 19, or both layers 9 and 19, after they have been formed, may be doped in a usual manner, for example from the gaseous phase, in which case PH$_3$ may be used.

Preferably, a protective layer 20 is provided on the further layer 19 of semiconductor material. This layer may be, for example, a silicon oxide layer, which may be provided simultaneously with the third layer 10. The third layer 10 may also be provided before the doping is introduced into the further layer 19 and the protective layer 20 may be provided after this doping treatment.

Due to the provision of the further layer 19, it is possible to carry out a getter treatment at any desired instant during the further process of manufacturing in a usual manner. A great advantage resides in the fact that implantation treatments at a high energy are generally carried out at comparatively early state of the whole entire manufacturing process so that with the use of the method according to the invention, the means for obtaining a good getter effect are present on the semiconductor body 1 already from this early stage of the manufacturing process. For example, it is favourable that already before gate dielectrics for field effect transistors are grown or applied, a getter treatment can be carried out. This may have a favourable effect on the quality of the semiconductor material in the active regions and of the gate dielectric. In general, after the implantation treatment at the given high energy, a getter treatment is advantageously carried out before one or more doping treatments for obtaining semiconductor zones of circuit elements. For example, the aforementioned annealing treatment(s) and the getter treatment may be carried out entirely or in part simultaneously as a combined treatment. During the getter treatment, the semiconductor body 1 is heated, for example, for about 15 minutes in an inert atmosphere at a temperature of about 925° C., after which cooling takes place in a usual manner.

The third layer 10 of silicon oxide in this example serves inter alia to obtain a good adhesion of the masking photolacquer layer used during etching of the openings 22 and 12. As the third layer 10, another dielectric material may also be used. The use of the third layer also affords the advantage that the openings 22 can be provided with great accuracy in this comparatively thin third layer and that furthermore, due to the favourable masking properties of the third layer, an accurate image of the openings 22 can be obtained in the second layer 9 during plasma etching of the openings 12.

The third layer 10 can be removed before or after the implantation treatment carried out at a high energy. Furthermore, the silicon nitride of the first layer 8 is removed from the openings 12 before or during, but preferably after the removal of the third layer 10. In the last-mentioned embodiment, the pattern of field insulation 6a cannot be attacked during removal of the third layer 10.

This is especially of importance if the pattern of field oxide 6a consists entirely or in part of the same material as the third layer 10. The silicon nitride is preferably removed from the openings 12 only after the implantation treatment. Subsequently, the second layer 9 can be removed. The active region 5 is then still protected by the thin silicon oxide layer 24. In a simplified and further schematized form, the semiconductor body 1 can be represented at this stage of the manufacturing process as in FIG. 2.

While using the remaining part of the first layer 8 as a masking layer, which was obtained from the masking 8, 9, 10, without a further photolithographic treatment being required, for example, a further implantation treatment may now be carried out. For example, boron may be implanted in order to adjust the threshold voltage of a p-channel field effect transistor to be provided in the active region 5. The dose can be about $1.10^{12}$ per cm$^2$ and the implantation energy may be about 25 keV. If required, before this implantation treatment, the oxide layer 24 may be removed from the active region 5 or may be replaced by an oxide layer having an accurately defined thickness.

After removal of the remaining part of the first layer 8, one or more implantation treatments may be carried out in the active region 4, in which case, if required, the active region 5 may be protected, for example, by a photolacquer mask.

Figure 3:
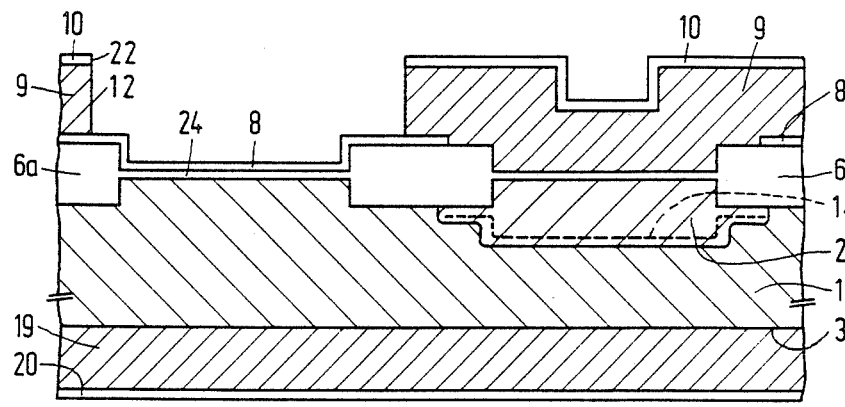

If an implantation treatment has also to be carried out at a high implantation energy in the active region 4, for example, if the remaining part of the first layer 8 is still present, a fresh second layer 9 of semiconductor material and a fresh third layer 10 may be provided. Subsequently, as already described above, openings 12 and 22 are provided in these layers 9 and 10, these openings being this time situated above the active region 4 (FIG. 3). In this variation of the masking 8, 9, 10, the first layer 8 is not a fully continuous layer, but this first layer 8 covers at least those parts of the surface of the semiconductor body 1 which correspond to the openings 12 in the second layer 9. Through the openings 12, for example, boron may be implanted comparatively deeply in the semiconductor body 1.

When by one or more implantation treatments the doping concentration profile of the p-type doping desired in the active region 4 also has been obtained in this region in the same manner as described for the active region 5, the layers 8, 9 and 10 of the masking have been removed, and a getter treatment has been carried out, the semiconductor body 1 is prepared to such an extent that field effect transistors can be further provided in a usual manner in the active regions 4 and 5. For illustration and by way of example, one of the possibilities for the further procedure of the manufacturing method will be shown hereinafter.

Figure 4:
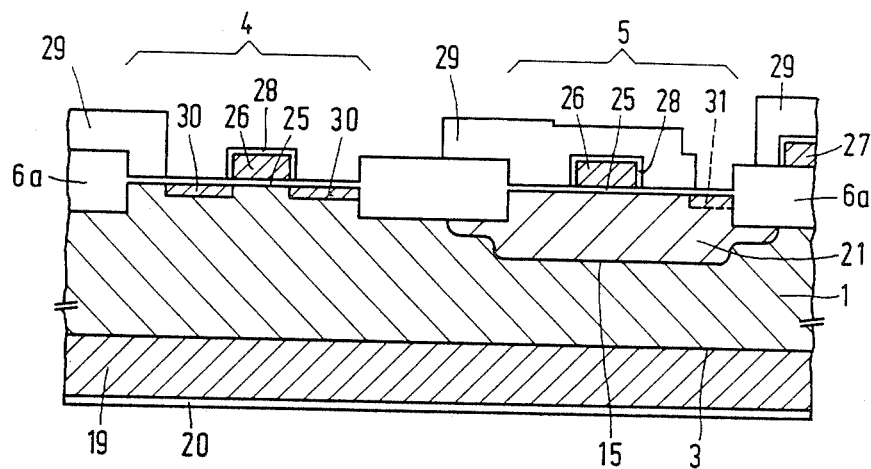

As far as the silicon oxide layer 24 is still present, it is removed and a fresh oxide layer is provided by thermal generation, which layer serves as a gate dielectric 25 (see FIG. 4). The thickness of this silicon oxide layer may be 30 to 50 nm. Over this oxide layer, a polycrystalline or amorphous silicon layer having a thickness of about 0.6 /μm can be provided by deposition from the gaseous phase at low pressure (LPCVD). This silicon layer is doped from the gaseous phase by means of PH$_3$ with phosphorus and is provided with a silicon oxide layer having a thickness of about 50 nm by oxidation.

Subsequently, the upper oxide layer and the silicon layer can be patterned in a usual manner so that the gate electrodes 26 and, as the case may be, also conductor tracks 27 are obtained. If desired, a short oxidation treatment may then be carried out in order also to cover the vertical walls of the gate electrodes 26 and the conductor tracks 27 with an oxide layer. The silicon tracks 26 and 27 are then fully enclosed by the oxide layers 28, 25 and 6a, respectively. A photolacquer layer 29 is then deposited and provided with a pattern. While using this photolacquer layer 29 as a masking layer, a doping for source and drain zones 30 and contact zones 31 for n-type regions 21 can be provided. For example, arsenic is implanted at a dose of about $5.10^{15}$ per cm$^2$ and an implantation energy of about 40 keV. FIG. 4 shows diagrammatically the semiconductor body 1 at this stage of the manufacture.

Subsequently, the photolacquer masking 29 is replaced by a photolacquer masking for providing the doping for p-type source and drain zones 32 and for contact zones 33. For example, as a dopant boron is implanted at a dose of about $3.10^{15}$ per cm$^2$ and an implantation energy of about 16 keV. The photolacquer masking is then removed and a silicon oxide layer 34 having a thickness of about 0.5 /μm is deposited. An annealing treatment can then be carried out, in which the semiconductor body 1 is heated, for example, for 30 to 60 minutes at a temperature of about 650° C. This treatment may also be carried out in part (for example for about 15 minutes) at a higher temperature of about 925° C., cooling then taking place in a usual manner so that a getter effect is also obtained.

Figure 5:
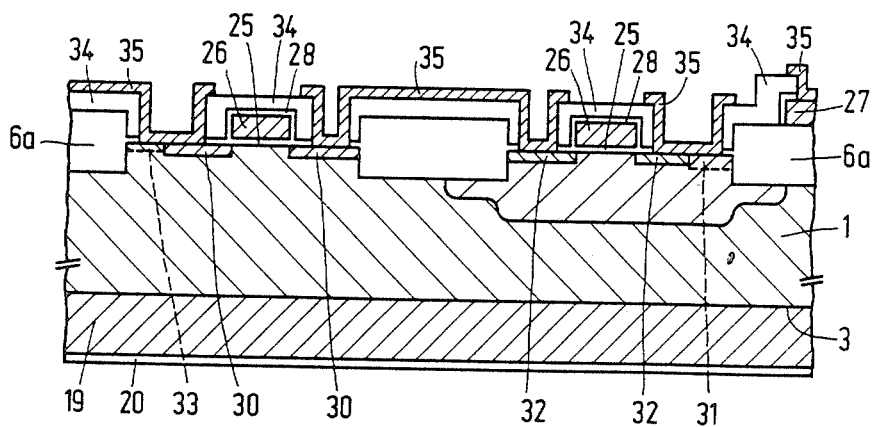

When contact openings have been provided in the oxide layers 34, 25 and 28, a conductive layer of, for example, aluminium can be deposited and be provided with a pattern by etching. If required, a barrier layer of, for example, tungsten or titanium may be provided under the aluminium. Furthermore, silicide may be provided or formed in the contact openings before the aluminium is deposited. Thus, the semiconductor device is provided with conductor tracks 35 for electrical connection and electrical interconnection of the circuit elements (FIG. 5). If desired, the semiconductor device may also be provided with one or more further layers of conductor tracks (not shown), which are separated by further insulating layers (not shown) from each other and/or from the layer of conductor tracks 35. Furthermore, the active side of the semiconductor body 1 of the semiconductor device may be covered substantially entirely by a protective insulating layer (not shown) of, for example, silicon nitride. Finally, the silicon wafer can be subdivided in a usual manner into separate integrated circuits and these integrated circuits can be finished in a usual manner in a conventional envelope.

The layers 19 and 20 on the major surface 3 are no longer required after the last getter treatment and may be removed, if desired, after this treatment. However, the removal of these layers is not necessary.

Figure 6:
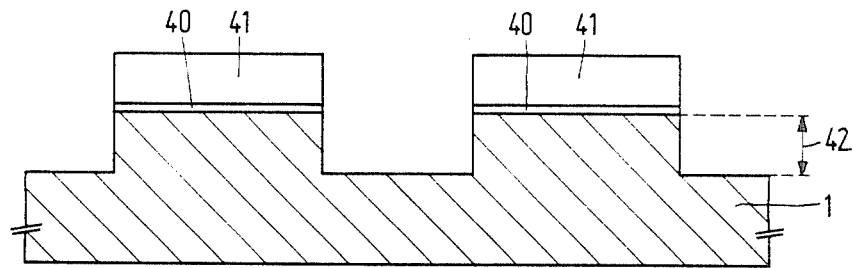
FIGS. 6 to 8 show cross-sections of a semiconductor body at different stages of the manufacture, which belongs to a modification of the first example of the method according to the invention.
Figure 7:
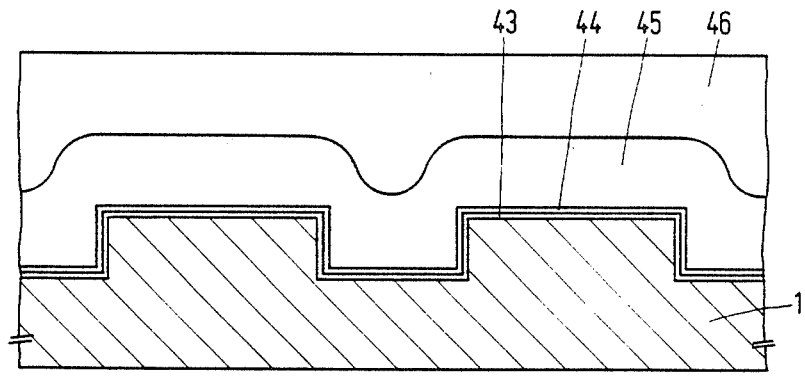
Figure 8:
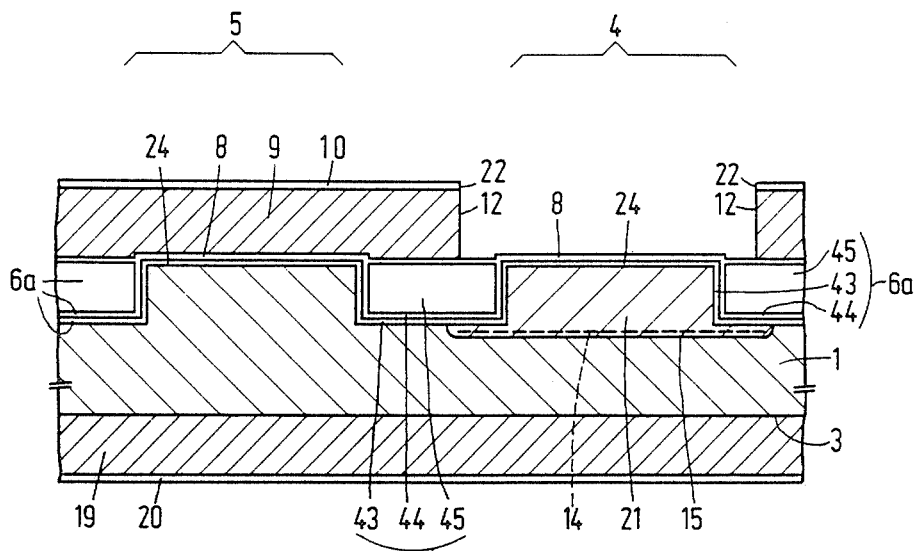

In the first example, the pattern of field insulation 6a is obtained by local oxidation of the silicon body 1. Such a pattern may also be obtained in a different manner, however. For example, in a variation of the first example, first the silicon wafer 1 is provided with an etching mask, which consists, for example, of a layer 40 of silicon oxide, which is patterned by means of a photolacquer mask 41 (FIG. 6). The etching mask 40 covers the active regions of the semiconductor device. After removal of the layer 41, grooves having a depth 42 of, for example, about 0.8 /μm are provided in the semiconductor body 1 by plasma etching. This groove depth can advantageously be chosen so that the line 14 of maximum concentration in the semiconductor body 1 under the ultimate field insulation extends immediately under the interface between the semiconductor material and the field insulation. If desired, for example, boron may be implanted in the walls of the grooves or in parts thereof for increasing the surface concentration in situ. The walls of the grooves can be provided with a silicon oxide layer 43 having a thickness of about 50 nm, after which a layer 44 of silicon nitride can be deposited having a thickness of about 0.1 /μm (FIG. 7). Subsequently, a layer 45 of polycrystalline or amorphous semiconductor material or of silicon oxide can be deposited. The thickness of the layer 45 can be about 1 /μm. Planarization can then take place in a usual manner, in which case, for example, a photolacquer layer 46 may be used. When etching back the layers 46, 45, this treatment can be stopped when the silicon nitride situated on the active regions has been reached. If the layer 45 consists of semiconductor material, the etching can be continued, whereupon the semiconductor material in the grooves can be oxidized in such a manner that the grooves are then completely filled again. After the silicon nitride 44 and the silicon oxide 43 have been removed from the active regions, a fresh silicon oxide layer 24 is formed on the active regions (FIG. 8). The semiconductor body 1 is now provided with a pattern of field insulation 6a, which mainly consists of the still remaining parts of the layers 43, 44 and 45.

Subsequently, the masking 8, 9, 10 can be provided in the manner already described and the further processing steps already described may also be carried out, as far as necessary. In FIG. 8, the semiconductor body 1 is shown at the same stage of the manufacture as that to which the invention relates.

In the second example, the semiconductor body 1 is also first provided in a usual manner with a pattern of field insulation 6a. Subsequently, the layers of the masking 8, 9, 10 are provided. After a photolacquer pattern has been provided on the third layer 10, the layers 10 and 9 are etched with a suitably chosen combination of isotropic and anisotropic etching being used at least during etching of the layer 9 so that openings 12 having oblique edges are obtained. Etching methods in which oblique edges are obtained are described in the technical literature. Examples thereof can be found in Solid State Technology, August 1982, p. 98–103, and in Journal Vacuum Science and Technology B, Vol. 3, No. 1, Jan.–Feb. 1985 p. 15–19. If required, after the layer 9 has been etched, the openings 22 in the layer 10 are enlarged, for example, by under-etching of the photolacquer pattern, or the third layer 10 is entirely removed (FIG. 9).

Figure 9:
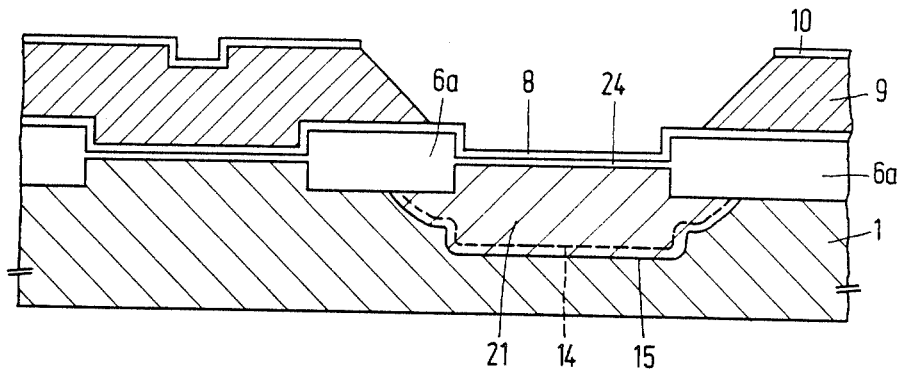
FIG. 9 shows a cross-section of a semiconductor body belonging to a second example of a method according to the invention.

The use of a semi-masking layer 9 provided with openings 12 having oblique edges, as shown in FIG. 9, has the advantage that after the implantation treatment at high energy, the line 14 of the maximum concentration of the dopant under the oblique edges of the openings 12 intersects the interface between the semiconductor material of the semiconductor body 1 and the adjoining material of the pattern of field insulation 6a. As a result, in the immediate proximity of this intersection of the line of maximum concentration and the interface, a comparatively high threshold voltage for parasitic channel formation and hence a comparatively satisfactory channel stopper effect is obtained.

Figure 10:
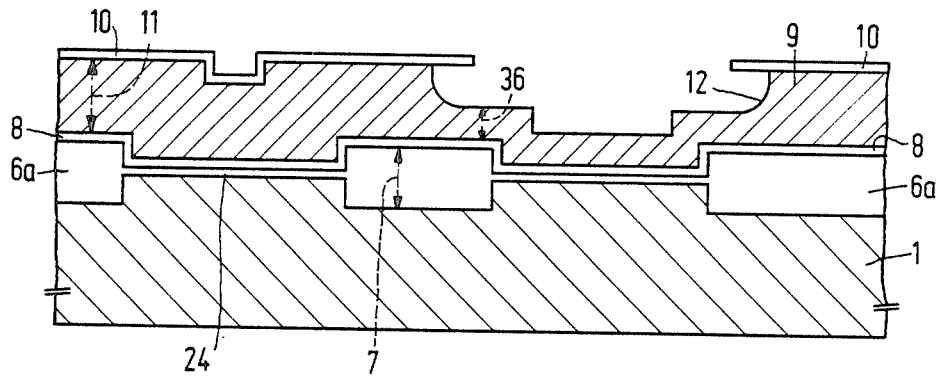
FIGS. 10 and 11 show cross-sections of a semiconductor body belonging to a modification of the second example.
Figure 11:
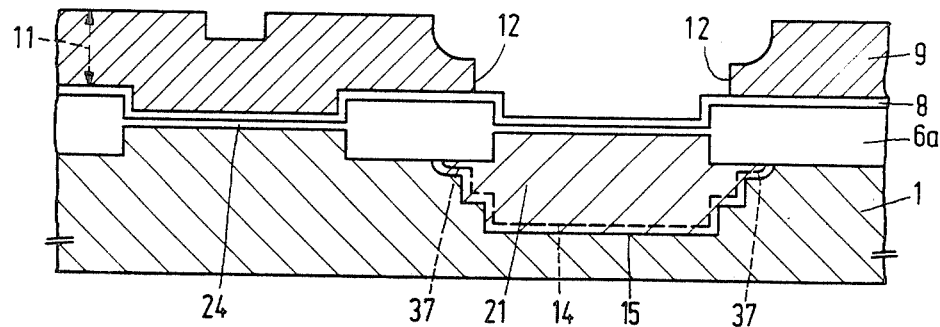

In a variation of the second example in FIGS. 10 and 11, there is first etched isotropically for some time until the remaining layer thickness 36 of the second layer 9 in the openings 12 is just so large that the accelerated ions to be used for implantation still can reach the semiconductor material of the semiconductor body 1 through the remaining part of the second layer 9 and the pattern of field insulation 6a (FIG. 10). The last part of the openings 12 is then etched anisotropically. After removal of the third layer 10 (FIG. 11), the implantation treatment is really carried out. The line 14 of the maximum concentration will extend in the semiconductor body 1 at the edges of the region 21 over a certain distance (the part 37) substantially parallel to and imediately under the interface between the semiconductor material and the pattern of field insulation 6a. As a result, a further improved channel stopper effect is obtained.

Figure 12:
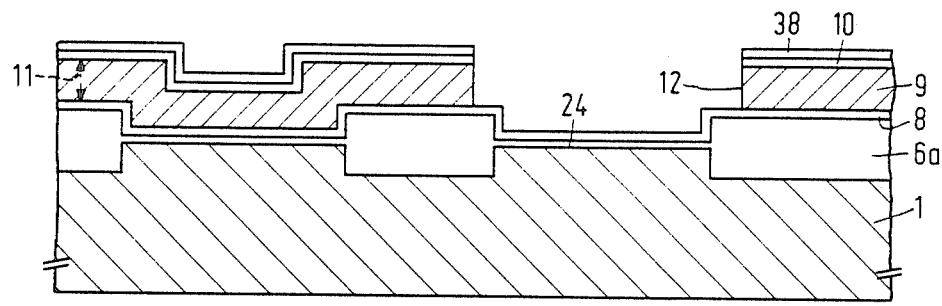
FIGS. 12 and 13 show cross-sections of a semiconductor body belonging to a third example of the method according to the invention.
Figure 13:
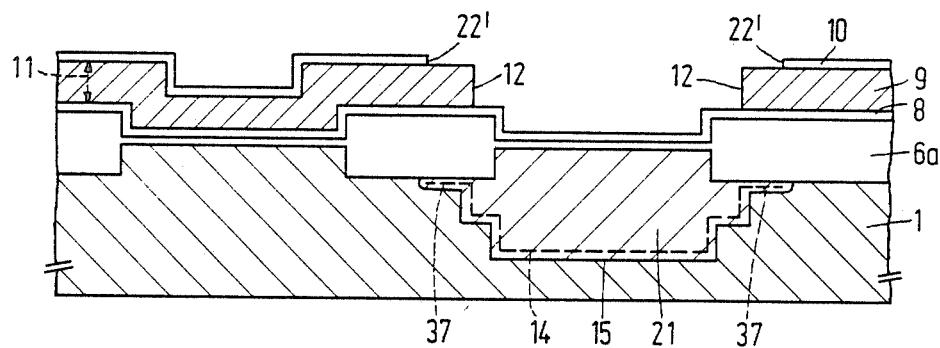

In the third example in FIGS. 12 and 13, a second layer 9 having a thickness 11 is used which is chosen so that the overall thickness of the second layer 9, the first layer 8 and the pattern of field insulation 6a is so large that the line of maximum concentration 14 extends, after the implantation treatment, under the field insulation 6a in the semiconductor material immediately under the interface with the field insulation and substantially parallel to this interface. The relevant part of the line 14 is denoted in FIG. 13 by reference numeral 37. The third layer 10 in this example consists of a satisfactorily masking material, such as molybdenum or tungsten. A further layer 38 of, for example, silicon oxide and/or photolacquer is provided on this third layer 10. Openings having the same size as the openings 12 are first provided in the layers 38, 10 and 9 (FIG. 12). Subsequently, the enlarged openings 22' are provided in the layer 10. The openings 22' are therefore derived from the same original pattern as the openings 12. The openings 22' are larger than the openings 12, but further correspond entirely to these openings 12. The layer 38 is then removed. Subsequently, the implantation treatment can be carried out (FIG. 13). Also in this example, the optimum channel stopper effect can thus be obtained under the field insulation 6a, which can be realized without a specific and additional implantation treatment being carried out.

It will be appreciated that in the third example the second thickness 11 of the second layer 9 is too small to obtain a substantially complete masking of the implanted dopant. In this example, this substantially complete masking is guaranteed by the use of the third layer 10 of satisfactorily masking material. In the examples, in which the masking 8, 9, 10 comprises only layers of semi-masking material, the overall thickness of the layers is invariably chosen so large, however, that outside the openings 12, 22 a substantially complete masking is obtained. In this connection, the second thickness 11 of the second layer 9 is preferably larger than the first thickness 7 of the pattern of field insulation 6a.

Figure 14:
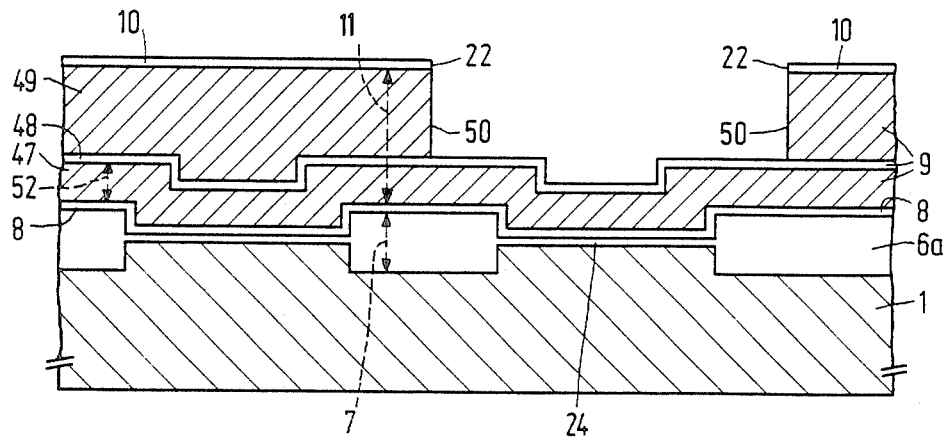
FIGS. 14 to 16 show cross-sections of a semiconductor body belonging to a fourth example of the method according to the invention.

In the fourth example, a layer 8 of silicon nitride, a layer 47 of amorphous or polycrystalline silicon, a layer 48 of silicon oxide or silicon nitride, a layer 49 of amorphous or polycrystalline silicon and a layer 10 of silicon oxide or silicon nitride are formed on the semiconductor body 1, which is already provided with the pattern of field insulation 6a. The layers 47, 48 and 49 together constitute the layer 9 of semi-masking material Openings 22 are first provided in the layer 10. The layer 10 then serves as a masking during etching of openings 50 in the layer 49 (FIG. 14).

Figure 15:
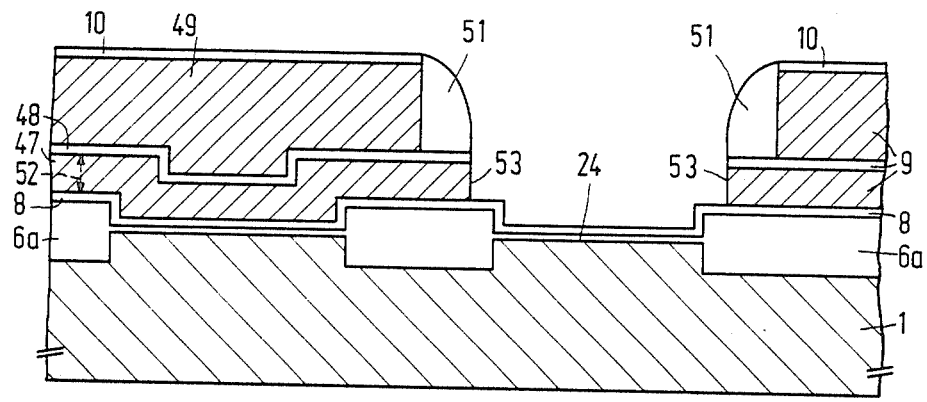

Subsequently, a layer of, for example, silicon oxide can be deposited, which is then removed anisotropically without a masking, for example by plasma etching, in such a manner that a part 51 is left along the edges of the openings 50 (FIG. 15). If the layer 48 consists of a material masking against oxidation, the edge portion 51 can also be obtained by oxidation of the layer 49. If the layer 10 then also consists of a material masking against oxidation, the oxidation treatment is sufficient. Preferably, the layer 10 is first removed (but without the part of the layer 48 exposed in the openings 50 also disappearing) or this layer 10 consists, for example, of silicon oxide. In this case, after the oxidation treatment of the layer 49, the oxide present is etched back anisotropically until practically only the edge portion 51 is left.

Openings 53 are then etched in the layer 47 with the exposed part of the layer 48 first being removed if this exposed part has not yet been etched away during the preceding processing steps. The thickness 52 of the sublayer 47 in this example is chosen to be substantially equal to the thickness 11 of the layer 9 in the example shown in FIG. 13. In the present example, the thickness 11 of the second layer 9 composed of the sublayers 47, 48 and 49 is further larger than the sum of the thicknesses 7 and 52 of the pattern of field insulation 6a and the lower sublayer 47, respectively. This thickness 11 is moreover chosen so large that outside the openings 22, 50 a substantially complete masking of the implanted dopant is obtained with the masking 8, 9, 10. This thickness 11 is preferably at least equal to the penetration depth 17 of the dopant in the part of the active regions located within the openings 12 and accessible for doping.

Subsequently, the edge portions 51 can be removed. If the layer 10 and/or the layer 48 consist of the same material, the layer 10 and/or the part of the layer 48 covered first by the edge portions 51 will disappear simultaneously. If the layer 10 and/or the layer 48 consist of a different material, a further etching treatment can be carried out before or after the implantation treatment at high energy, in which further etching treatment the exposed part of the layer 8 may also be removed simultaneously.

Figure 16:
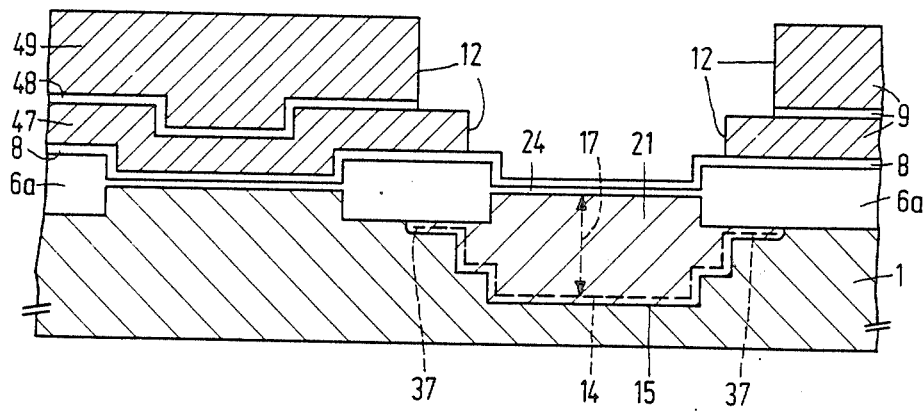

FIG. 16 shows the semiconductor body 1 after the implantation treatment. The openings 50 and 53 in the layer 49 and the layer 47, respectively, together constitute the openings 12 in the layer 9 of semi-masking material, which have a stepped profile. As a result, a doping concentration profile is obtained which is comparable with that of the example shown in FIG. 13. The line 14 of maximum concentration of the doping extends over a distance 37 accurately defined by the stepped profile of the opening 12 immediately under and substantially parallel to the interface between the pattern of field insulation 6a and the semiconductor material of the semiconductor body 1.

When comparing the third and fourth examples, it appears that the intermediate layer 47 of the fourth example may be replaced by the satisfactorily masking third layer 10 of the third example. The layer 10 of the fourth example, which then no longer serves as the third layer of the masking, and the sublayer 49 are then auxiliary layers which serve to realize in an accurate manner the openings 12, 22' shown in FIG. 13.

If in the fourth example the getter layer 19 (not shown) is present on the back side of the semiconductor body 1, this layer 19 can be provided simultaneously with the sublayer 47 and/or simultaneously with the sublayer 49.

In the examples described, especially the second layer 9 will have a sufficiently large thickness to be used as a lift-off masking. For example, a comparatively thin layer of molybdenum or another suitable material may be vapour-deposited in a direction substantially at right angles to the major surface 2 of the semiconductor body 1. Subsequently, the layer 9 can be removed, the part of the vapour-deposited molybdenum layer present thereon then also disappearing. Thus, a molybdenum pattern is obtained which forms an accurate image of the openings 12. Where openings 12 were present, the surface is covered with molybdenum, whereas no molybdenum is present on the remaining part of the surface. This molybdenum pattern may be used, for example, as a masking during further desired treatments of the semiconductor body. If in the example shown in FIG. 13 before the vapour-deposition of the molybdenum layer the openings 22' are used to selectively remove the part of the layer 9 exposed within these openings, the ultimate molybdenum pattern accurately covers the doped regions 21. In a similar manner, in the example shown in FIG. 16, while using the sublayer 49 provided with openings 50 as a masking layers, the exposed part of the sublayer 47 can first be removed. Also in this case, the molybdenum pattern will cover accurately the doped regions 21.

In all examples, the first layer 8 protects the underlying semiconductor body during the step of providing the openings 22 and/or 12. In this connection, an important advantage is obtained if the first material of the first layer 8 differs from the material from which the pattern of the field insulation 6a is formed at least for the major part. Generally, the last-mentioned material will be silicon oxide. In the example shown in FIG. 8, this main component of the pattern of field insulation 6a may also be a semiconductor material. As the first material use is preferably made of silicon nitride. The use of this material affords the great advantage that the further materials used for the layers 9 and 10, 47, 48 and 49 and the edge portions 51 need not be selectively removable with respect to the material of the pattern of field insulation 6a. Especially for the layers 10 and 48 and for the edge portions 51 silicon oxide can then be used. The relevant silicon oxide can in fact be etched away without the pattern of field insulation 6a covered by the first layer 8 being attacked.

Only for the first example the manner is described in which the manufacturing process can be continued and accomplished after the implantation treatment at high energy. The further examples described of the method according to the invention may be accomplished in a similar manner or in a different known manner. It is then especially decisive what circuit elements have to be realized.

The present invention is otherwise not limited to the embodiments described. Within the scope of the invention many variations are possible for those skilled in the art. For example, semiconductor materials other than silicon, such as germanium or $A^{III}B^{V}$ compounds, may be used. If the third layer 10 comprises a layer of silicon oxide, the latter may be formed instead of by thermal generation, for example, and also by deposition. This also applies, for example, to the layers 20 and 43. It is not necessary to provide a doping up to a high concentration in the layer 19 to obtain a getter effect. Furthermore, in the examples shown in FIGS. 9 to 16, a layer 19 may also be provided on the back side of the semiconductor body 1. This layer 19 may be provided simultaneously with the layer 9, the sublayer 47 and/or the sublayer 49.

For the sake of simplicity, in most of the examples the influence of the presence of thin layers within the openings 12 on the penetration depth of the implanted doping in the semiconductor material of the semiconductor body 1 is neglected or is at least left out of consideration. It will be appreciated that, especially if beforehand an accurate estimation of the resulting doping concentration profile is desired, the influence of all the layers located within the openings 12 as to their thickness and their specific penetration depth (stopping power) has to be taken into account.

In the examples, the first material of the first layer 8 differs from the second material of the second layer 9 and the latter material in turn differs from the third material of the third layer 10. If the second layer 9 is composed of a number of sublayers, as in the example shown in FIGS. 14 to 16, an intermediate sublayer may be used, which consists of the same material as the third layer 10 or of the same material as the first layer 8. Although this is not necessary, the first material preferably also differs from the third material.

In the example shown in FIGS. 14 to 16, at least one of the sublayers 47 and 49 preferably consists of semiconductor material. In this example, the thickness of the sublayer 49 is not only chosen at least so that outside the openings 12 the desired practically entire masking is obtained, but is also chosen so that edge portions 51 of suitable dimensions can be obtained.

If the second layer 9 consists entirely or in part of the same semiconductor material as the semiconductor body 1 and/or the layer 45 and at least a part of the second layer 9 has still to be removed at a stage at which the first layer 8 does not form a continuous layer, the semiconductor material of the semiconductor body 1 and/or the layer 45 is preferably covered by a protective layer, such as the layer 24, which is provided before the first layer 8 of the masking 8, 9, 10 was provided. Preferably, this protective layer consists of insulating material which differs from the first material of the first layer 8.

The masking 8, 9, 10 is preferably sufficiently thick to obtain outside the openings of the second pattern a practically complete masking of the implanted dopant. A complete masking is not always necessary. If after the implantation treatment at high energy the concentration of the implanted dopant in the semiconductor material of the semiconductor body 1 is small under the masking 8, 9, 10 so outside the openings of the second pattern, with respect to the background doping concentration present or with respect to doping concentrations to be provided later in the relevant region of the semiconductor body 1, such a non-complete masking will generally be admissible. Furthermore, the doping quantity obtained with a non-complete masking under the masking 8, 9, 10 may be used, for example, inter alia for the adjustment of the threshold voltage of field effect transistors to be realized in the relevant semiconductor region.

For each of the layers 8, 10 and 48, a suitable choice may be made from materials, such as silicon oxide, silicon nitride and aluminium oxide. For the third layer 10, in general also a suitable metal, which in the examples other than the example shown in FIGS. 12 and 13 need not be satisfactorily masking layer, may be used. For the layer 49, besides semiconductor material, an oxide or, for example, polyimide may also be used. The layer 9 may also consist of a suitable photolacquer. In this case, for example, spin-on glass or aluminium, chromium or another suitable metal may be used for the layer 10.

What is claimed is:

1. A method of manufacturing a semiconductor device comprising the steps of forming at least a first pattern of field insulation at a first major surface of a semiconductor body, said first pattern bounding at least one active region at said first major surface, and said first pattern having a predetermined thickness;

forming a masking structure on said first major surface, said masking structure having at least one opening above at least a part of said at least one active region;

carrying out ion implantation to said at least one active region through said at least one opening to dope said at least one active region to a depth at least approximately equal to said predetermined thickness;

wherein said masking structure is formed on said first major surface by the steps of forming a first masking layer on said first major surface, said first masking layer being of a first thickness, and said first masking layer being of a different material from said first pattern of field insulation, forming a second masking layer on said first masking layer, said second masking layer being of a second thickness greater than said first thickness, and said second masking layer being of a different material than said first masking layer, and forming a third masking layer on said second masking layer, said third masking layer being of a third thickness less than said second thickness, and said third masking layer being of a different material than said second masking layer, wherein said at least one opening is formed through said second masking layer and said third masking layer, said first masking layer covering at least parts of said first major surface at said at least one opening through said second and third masking layer.

2. A method according to claim 1, wherein said third masking layer is formed of a material different from the material of said first masking layer.

3. A method according to claim 1 or claim 2, wherein said first masking layer is formed of silicon nitride.

4. A method according to claim 1 or claim 2, wherein said second masking layer consists of semiconductor material.

5. A method according to claim 1 or claim 2, wherein said second masking layer includes a plurality of sublayers, and wherein one of said sublayers consists of semiconductor material.

6. A method according to claim 1 or claim 2, wherein said second thickness of said second masking layer is formed to be larger than said predetermined thickness of said first pattern of field insulation.

7. A method according to claim 4, wherein a further layer of semiconductor material is formed at a second major surface of said semiconductor body opposite to said first major surface simultaneously with formation of said second masking layer, said second major surface extending substantially parallel to said first major surface.

8. A method according to claim 5, wherein a further layer of semiconductor material is formed at a second major surface of said semiconductor body opposite to said first major surface simultaneously with formation of said second masking layer, said second major surface extending substantially parallel to said first major surface.

9. A method according to claim 7, wherein at least a considerable portion of said second major surface is cleaned before forming said further layer, and wherein said further layer is then provided immediately on said second major surface.

10. A method according to claim 7, wherein said further layer is formed of a semiconductor material having a high concentration of dopant.

11. A method according to claim 7, wherein said further layer is covered by a protective layer.

12. A method according to claim 7, wherein a getter treatment is carried out on said semiconductor body after said step of carrying out ion implantation and before doping said at least one active region to obtain semiconductor zones for circuit elements.

13. A method according to claim 8, wherein at least a considerable portion of said second major surface is cleaned before forming said further layer, and wherein said further layer is then provided immediately on said second major surface.

14. A method according to claim 8, wherein said further layer is formed of a semiconductor material having a high concentration of dopant.

15. A method according to claim 8, wherein said further layer is covered by a protective layer.

16. A method according to claim 8, wherein a getter treatment is carried out on said semiconductor body after said step of carrying out ion implantation and before doping said at least one active region to obtain semiconductor zones for circuit elements.

* * * * *